(12) United States Patent
Fiore

(10) Patent No.: US 12,375,049 B2
(45) Date of Patent: Jul. 29, 2025

(54) BALANCED POWER AMPLIFIER SINGLE-POLE DOUBLE-THROW SWITCH WITH OFFSET-QPSK OR IQ MODULATOR FUNCTIONALITY

(71) Applicant: Infineon Technologies AG, Neubiberg (DE)

(72) Inventor: Vincenzo Fiore, Linz (AT)

(73) Assignee: Infineon Technologies AG, Neubiberg (DE)

( * ) Notice: Subject to any disclaimer, the term of this patent is extended or adjusted under 35 U.S.C. 154(b) by 715 days.

(21) Appl. No.: 17/677,043

(22) Filed: Feb. 22, 2022

(65) Prior Publication Data

US 2023/0268893 A1    Aug. 24, 2023

(51) Int. Cl.
*H03F 3/24* (2006.01)
*G01S 13/06* (2006.01)
(Continued)

(52) U.S. Cl.
CPC .............. *H03F 3/245* (2013.01); *G01S 13/06* (2013.01); *G01S 13/584* (2013.01); *H01P 5/227* (2013.01); *H03F 1/56* (2013.01); *H03F 2200/451* (2013.01)

(58) Field of Classification Search
CPC ...... H03F 3/245; H03F 1/56; H03F 2200/451; H03F 2200/192; H03F 2200/198; H03F 2200/204; H03F 3/195; H03F 3/211; H03F 3/602; G01S 13/06; G01S 13/584; G01S 7/03; G01S 13/343; H01P 5/227
(Continued)

(56) References Cited

U.S. PATENT DOCUMENTS 5,066,924 A * 11/1991 Wendt .................... H03F 3/602
330/144
2019/0198957 A1    6/2019 Sharma
(Continued)

FOREIGN PATENT DOCUMENTS

GB            2359431 A      8/2001

OTHER PUBLICATIONS

Pashaeifar, Masoud et al. "A Millimeter-Wave Mutual-Coupling-Resilient Double-Quadrature Transmitter for 5G Applications." IEEE Journal of Solid-State Circuits. vol. 56. No. 12. pp. 1-15. Dec. 2021. doi: 10.1109/JSSC.2021.3111126.

*Primary Examiner* — Andrea Lindgren Baltzell
*Assistant Examiner* — Jose E Pinero
(74) *Attorney, Agent, or Firm* — Harrity & Harrity, LLP

(57) ABSTRACT

A balanced power amplifier includes a first power amplifier configured to apply a first gain having a first predetermined magnitude and a first programmable phase adjustable phase to generate a first amplified signal, the first programmable phase being adjustable to either a first phase or to a second phase that is 180° phase shifted relative to the first phase; a second power amplifier configured to apply a second gain having a second predetermined magnitude and a second programmable phase to generate a second amplified signal, the second programmable phase being adjustable to either the first phase or to the second phase; and a 90° hybrid coupler configured to receive the first amplified signal and the second amplified signal and generate and output a first output signal or a second output signal based on a combination of the first amplified signal and the second amplified signal.

33 Claims, 7 Drawing Sheets

(51) Int. Cl.
  *G01S 13/58* (2006.01)
  *H01P 5/22* (2006.01)
  *H03F 1/56* (2006.01)

(58) Field of Classification Search
  USPC ........................................................ 330/295
  See application file for complete search history.

(56) References Cited

U.S. PATENT DOCUMENTS

2019/0341960 A1* 11/2019 Pal ............................ H04J 3/02
2021/0376802 A1* 12/2021 Sharma ..................... H03F 1/56

* cited by examiner

BALANCED POWER AMPLIFIER SINGLE-POLE DOUBLE-THROW SWITCH WITH OFFSET-QPSK OR IQ MODULATOR FUNCTIONALITY

BACKGROUND

Modern radar devices such as radar range and velocity sensors can be integrated in so-called monolithic microwave integrated circuits (MMICs). Radar sensors may be applied, for example, in the automotive sector, where they are used in so-called advanced driver assistance systems (ADAS) such as, for example, "adaptive cruise control" (ACC) or "radar cruise control" systems. Such systems may be used to automatically adjust the speed of an automobile so as to maintain a safe distance from other automobiles travelling ahead. However, RF circuits are also used in many other fields such as RF communication systems.

A radar MMIC (sometimes referred to as single chip radar) may incorporate all core functions of the RF frontend of a radar transceiver (e.g., local oscillator, power amplifiers, low-noise amplifiers (LNA), mixers, etc.), the analog preprocessing of the intermediate frequency (IF) or base band signals (e.g., filters, amplifiers, etc.), and the analog-to-digital conversion in one single package. The RF frontend usually includes multiple reception (RX) and transmission (TX) channels, particularly in applications in which beam steering techniques, phased antenna arrays, etc. are used. In radar applications, phased antenna arrays may be employed to sense the incidence angle of incoming RF radar signals (also referred to as "Direction of Arrival", DOA).

In the context of radar MMICs, so-called "cascaded systems" have emerged, whereby multiple MMICs are interconnected to embody a single overall system with increased resolution for radar targets discrimination. In a Multiple-Input Multiple-Output (MIMO) system, a local oscillator source distributes an RF signal to the transmission and reception channels of each radar MMIC. For several applications, the phase relationship between channels, both from an inter-chip and intra-chip perspective, is important. A phase difference between transmission channels can drift or become unbalanced, for example, due to temperature changes. This parameter is called phase drift and ensuring low phase drift is technically challenging. Transmission signal monitoring can be used to measure the phase of each inter-chip and/or intra-chip TX channel and phase shifters can be used to calibrate each transmission channel based on the result to minimize the phase drift (so called phase balancing).

The typical implementation of transmission signal monitoring is based on simple passive devices (directional couplers, capacitive couplers) to couple the monitoring signal out from the transmission signal path. However, the transmission signal path is superimposed to the transmission monitoring signal path with a fixed coupler power loss. Moreover, when the gain of the transmission signal path is set low, transmission signal monitoring may not be feasible due to the additional coupler power loss. In other words, the power of the monitoring signal may be too faint to provide a reliable measurement. Accordingly, there is a resulting trade-off between gain settings applied on the transmission signal path and the coupler power loss that impacts monitoring accuracy.

Additionally, for advanced MIMO and reconfigurable radars it may be useful to have a high number of transmitter outputs on chip, with each transmitter output coupled to a different antenna. However, because each TX channel requires its own power amplifier, each additional TX channel further increases the chip area overhead to accommodate the additional power amplifiers. Additionally, on-chip switches are not possible due to the high-power losses that are typical of switches.

Accordingly, an improved circuit for coupling a monitoring signal out from the transmission signal path without a coupler power loss may be desirable. Additionally, an improved circuit that can perform a power switch function between two outputs may be desirable. The power switch function could be used to steer output signals between an antenna output and a monitoring circuit or to steer output signals between two antenna outputs without coupler or switch power losses.

SUMMARY

One or more embodiments provide a balanced power amplifier including: a first 90° hybrid coupler including a first RF input configured to receive a first RF signal, wherein the first 90° hybrid coupler is configured to generate a first intermediate signal based on the first RF signal and generate a second intermediate signal based on the first RF signal, wherein a phase of the second intermediate signal is 90° phase shifted relative to a phase of the first intermediate signal; a first power amplifier including a first control input for receiving a first phase control signal, wherein the first power amplifier is configured to receive the first intermediate signal and apply a first gain to the first intermediate signal to generate a first amplified signal, wherein the first gain has a first predetermined magnitude and a first programmable phase adjustable by the first phase control signal, wherein the first phase control signal is configured to set the first programmable phase to either a first phase or to a second phase that is 180° phase shifted relative to the first phase; a second power amplifier including a second control input for receiving a second phase control signal, wherein the second power amplifier is configured to receive the second intermediate signal and apply a second gain to the second intermediate signal to generate a second amplified signal, wherein the second gain has a second predetermined magnitude and a second programmable phase adjustable by the second phase control signal, wherein the second phase control signal is configured to set the second programmable phase to either the first phase or to the second phase that is 180° phase shifted relative to the first phase; and a second 90° hybrid coupler including a second RF input configured to receive the first amplified signal, a third RF input configured to receive the second amplified signal, a first output port configured to output a first output signal, and a second output port configured to output a second output signal, wherein the second 90° hybrid coupler is configured to generate and output the first output signal based on a combination of the first amplified signal and the second amplified signal when the first programmable phase and the second programmable phase are 180° out-of-phase, and generate and output the second output signal based on a combination of the first amplified signal and the second amplified signal when the first programmable phase and the second programmable phase are in-phase.

One or more embodiments provide a balanced power amplifier including: a first power amplifier including a first control input for receiving a first phase control signal and a second control input for receiving a first magnitude control signal, wherein the first power amplifier is configured to receive a first portion of an input RF signal and apply a first gain to the first portion of the input RF signal to generate a first RF signal, wherein the first gain has a first programmable magnitude adjustable by the first magnitude control signal and a first programmable phase adjustable by the first phase control signal, wherein the first magnitude control signal is configured to set the first programmable magnitude to either zero or to a first predetermined magnitude, and wherein the first phase control signal is configured to set the first programmable phase to either the first phase or to the second phase that is 180° phase shifted relative to the first phase; a second power amplifier including a third control input for receiving a second phase control signal and a fourth control input for receiving a second magnitude control signal, wherein the second power amplifier is configured to receive a second portion of the input RF signal and apply a second gain to the second portion of the input RF signal to generate a second RF signal, wherein the second gain has a second programmable magnitude adjustable by the second magnitude control signal and a second programmable phase adjustable by the second phase control signal, wherein the second magnitude control signal is configured to set the second programmable magnitude to either zero or to a second predetermined magnitude, and wherein the second phase control signal is configured to set the second programmable phase to either the first phase or to the second phase that is 180° phase shifted relative to the first phase; a first 90° hybrid coupler including a first RF input configured to receive the first RF signal and a second RF input configured to receive second RF input signal, wherein the first 90° hybrid coupler is configured to generate a first intermediate signal and the second intermediate signal based on the first RF signal or the second RF signal, wherein a phase of the second intermediate signal is 90° phase shifted relative to a phase of the first intermediate signal; and an output circuit including an output port for outputting an output signal, wherein the output circuit is configured to receive the first intermediate signal and the second intermediate signal and steer an output phase of the output signal between 0°, 90°, 180°, and 270° relative phases based on the first intermediate signal and the second intermediate signal.

One or more embodiments provide a balanced power amplifier including: a first power amplifier comprising a first control input for receiving a first phase control signal and a second control input for receiving a first magnitude control signal, wherein the first power amplifier is configured to receive a first portion of an input RF signal and apply a first gain to the first portion of the input RF signal to generate a first RF signal, wherein the first gain has a first programmable magnitude adjustable by the first magnitude control signal and a first programmable phase adjustable by the first phase control signal, wherein the first magnitude control signal is configured to set the first programmable magnitude according to a IQ modulation vector, and wherein the first phase control signal is configured to set the first programmable phase according to the IQ modulation vector; a second power amplifier comprising a third control input for receiving a second phase control signal and a fourth control input for receiving a second magnitude control signal, wherein the second power amplifier is configured to receive a second portion of the input RF signal and apply a second gain to the second portion of the input RF signal to generate a second RF signal, wherein the second gain has a second programmable magnitude adjustable by the second magnitude control signal and a second programmable phase adjustable by the second phase control signal, wherein the second magnitude control signal is configured to set the second programmable magnitude according to the IQ modulation vector, and wherein the second phase control signal is configured to set the second programmable phase according to the IQ modulation vector; and a first 90° hybrid coupler configured to generate an output signal having the IQ modulation vector based on a combination of the first RF signal and the second RF signal.

One or more embodiments provide a method of controlling at least one RF output, the method including: generating, by a first 90° hybrid coupler, a first coupler output signal based on a first RF signal; generating, by the first 90° hybrid coupler, a second coupler output signal based on the first RF signal, wherein a phase of the second coupler output signal is 90° phase shifted relative to a phase of the first coupler output signal; applying, by a first power amplifier, a first gain to the first coupler output signal to generate a first amplified signal, wherein the first gain has a first predetermined magnitude and a first programmable phase adjustable by a first phase control signal, wherein the first phase control signal is configured to set the first programmable phase to either a first phase or to a second phase that is 180° phase shifted relative to the first phase; applying, by a second power amplifier, a second gain to the second coupler output signal to generate a second amplified signal, wherein the second gain has a second predetermined magnitude and a second programmable phase adjustable by a second phase control signal, wherein the second phase control signal is configured to set the second programmable phase to either the first phase or to the second phase that is 180° phase shifted relative to the first phase; generating and outputting, by a second 90° hybrid coupler, a first output signal from a first output port of the second 90° hybrid coupler based on a combination of the first amplified signal and the second amplified signal when the first programmable phase and the second programmable phase are 180° out-of-phase; and generating and outputting, by a second 90° hybrid coupler, a second output signal from a second output port of the second 90° hybrid coupler based on a combination of the first amplified signal and the second amplified signal when the first programmable phase and the second programmable phase are in-phase.

BRIEF DESCRIPTION OF THE DRAWINGS

Embodiments are described herein making reference to the appended drawings.

DETAILED DESCRIPTION

Figure 1:
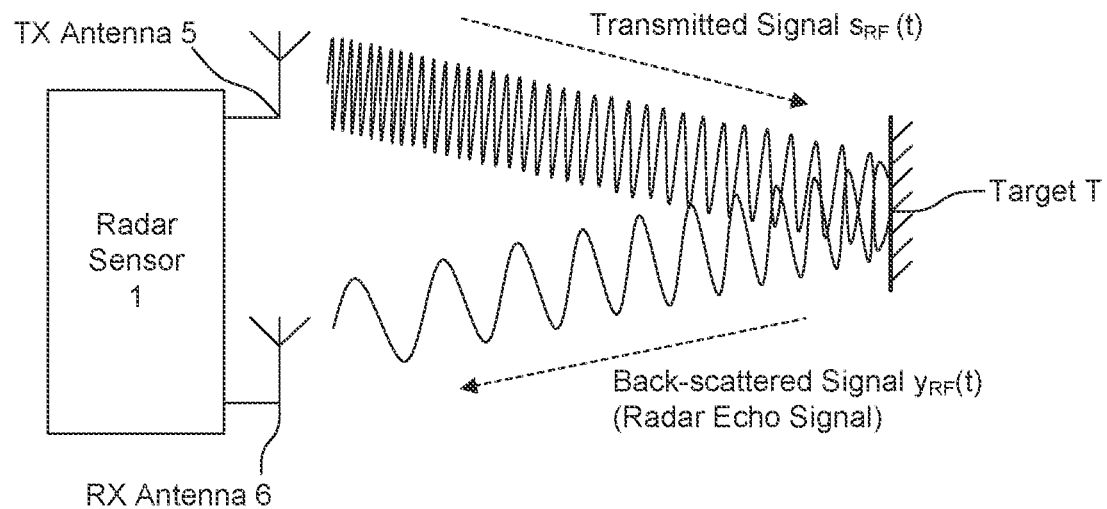
FIG. 1 is a drawing illustrating the operating principle of a frequency-modulated continuous-wave (FMCW) radar system for distance and/or velocity measurement according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Each of the elements of the present disclosure may be configured by implementing dedicated hardware or a software program on a memory controlling a processor to perform the functions of any of the components or combinations thereof. Any of the components may be implemented as a central processing unit (CPU) or other processor reading and executing a software program from a recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPGAs), programmable logic controller (PLC), or other equivalent integrated or discrete logic circuitry.

Accordingly, the term "processor," as used herein refers to any of the foregoing structures or any other structure suitable for implementation of the techniques described herein. A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals from one or more components and perform signal conditioning or processing thereon. Signal conditioning, as used herein, refers to manipulating a signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Thus, a signal processing circuit may include an analog-to-digital converter (ADC) that converts the analog signal from the one or more sensor elements to a digital signal. The signal processing circuit may also include a DSP that performs some processing on the digital signal.

Embodiments are discussed below in the context of a radar system. It should be noted, however, that the described embodiments may also be applied in applications different from radar such as, for example, RF transceivers of RF communication devices.

FIG. 1 illustrates a frequency-modulated continuous-wave (FMCW) radar system 1. In the present example, separate transmission (TX) and reception (RX) antennas 5 and 6, respectively, are used. However, it is noted that a single antenna can be used so that the transmission antenna and the reception antenna are physically the same (monostatic radar configuration). It will be appreciated that "(t)" denotes an analog signal defined as a continuous wave that may change over a time period t, and "(k)" denotes a digital signal defined as a discrete wave, where k is an integer and may represent a kth digital sample or a digital signal containing k digital samples. A signal may be represented with or without its analog or digital domain identifier (t) and (k), respectively.

The transmission antenna continuously radiates an RF signal $S_{RF}(t)$, which is frequency-modulated, for example, by a periodic linear frequency ramp signal (also referred to as frequency sweep or chirp signal). The transmitted signal $S_{RF}(t)$ is back-scattered at a target T, which is located in the radar channel within the measurement range of the radar device. The back-scattered signal $y_{RF}(t)$ is received by the reception antenna 6 as a radar echo. In the depicted example, the back-scattered signal is denoted as $y_{RF}(t)$.

Figure 2:
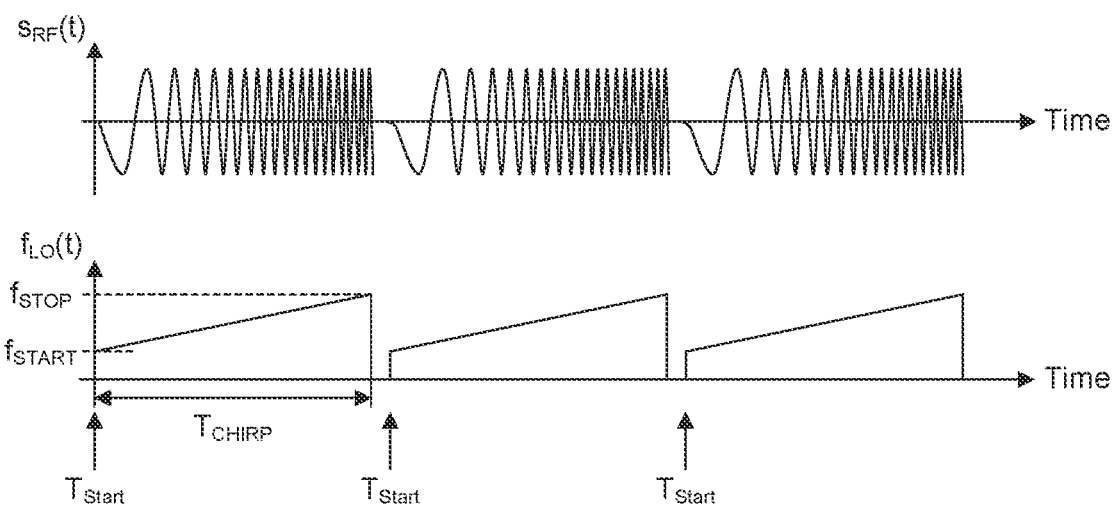
FIG. 2 includes two timing diagrams illustrating the frequency modulation of the radio frequency (RF) signal used in FMCW radar systems according to one or more embodiments.

FIG. 2 includes two timing diagrams illustrating the frequency modulation of the RF signal $S_{RF}(t)$ used in FMCW radar systems. As shown in FIG. 2, the signal $S_{RF}(t)$ may be composed of a plurality of frequency ramps or "chirps", that is to say the signal $S_{RF}(t)$ comprises a sequence of sinusoidal signal profiles (waveforms) with rising frequency (up-chirp) or falling frequency (down-chirp). In the present example, the instantaneous frequency $f_{LO}(t)$ of a chirp increases linearly, starting at a start frequency $f_{START}$ to a stop frequency $f_{STOP}$ within a time interval $T_{CHIRP}$. Such chirps are also referred to as linear frequency ramps.

A frequency-modulated ramp signal, such as local oscillator signal used for generating a radar signal, may include a plurality of radar frames which may also be referred to as radar operation cycles or chirp frames. A sequence of ramps may make up each a radar frame. For example, a radar operation cycle may include several hundreds of radar ramps (sweeps) taking up to 10-30 ms in total. A frame length of the radar frame corresponds to one radar operation cycle. It is also to be noted that consecutive ramps have a short pause therebetween and a longer pause may be used between consecutive radar frames. The longer pause between consecutive radar frames may be referred to as a configuration interval during which one or more ramp parameters of the RF signal $S_{RF}(t)$ can be adjusted for subsequent radar frames. A ramp start time $T_{START}$ indicates a start time for each chirp and may be a predetermined interval according to, for example, a number of clock cycles.

It will be appreciated that the start frequency $f_{START}$ and stop frequency $f_{STOP}$ of the ramps may be within a frequency band with minimum frequency Fmin and maximum frequency Fmax. As such, frequency Fmin and frequency Fmax define an operating frequency range or the frequency band usable for the ramping signals, and, thus, the frequency range or the frequency band of the radar application of the radar MMIC. In some embodiments, the frequency range defined by a single ramp having start and stop frequencies $f_{START}$ and $f_{STOP}$ may be smaller than the usable radar frequency band. However, all ramps that are generated during operation lie between the frequencies Fmin and Fmax of the radar frequency band (e.g., between 76-81 GHz) used for generating the ramping signals.

FIG. 2 illustrates three identical linear frequency ramps or chirps. It is noted, however, that the parameters $f_{START}$, $f_{STOP}$, $T_{CHIRP}$ as well as the pause between the individual frequency ramps may vary dependent on the actual implementation and use of the radar device 1. In practice, the frequency variation may be, for example, linear (linear ramp, frequency ramp), exponential (exponential ramp), or hyperbolic (hyperbolic ramp). In some embodiments, the frequency may decrease instead of increase during time $T_{CHIRP}$. Furthermore, in other embodiments the center frequency of each ramp (and therefore $f_{START}$ and $f_{STOP}$) may vary (e.g., from ramp to ramp or after detecting an interference) to allow using the full or a part of the frequency band. In one example, the frequency band has a minimum frequency Fmin of 76 GHz and a maximum frequency Fmax of 81 GHz.

Figure 3:
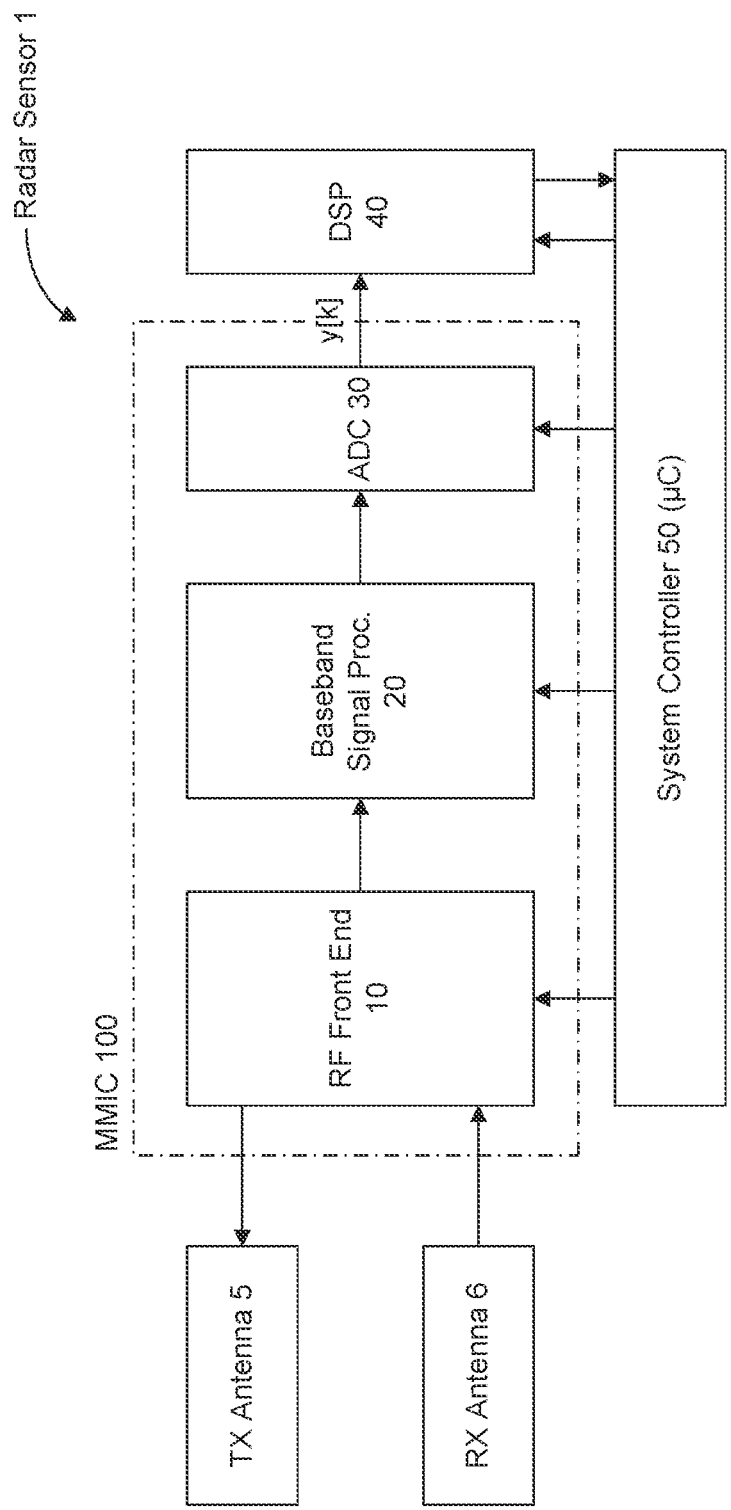
FIG. 3 is a block diagram illustrating the basic structure of an FMCW radar device according to one or more embodiments.

Thus, while three identical linear frequency ramps or chirps with the same start frequency $f_{START}$ and stop frequency $f_{STOP}$ are illustrated in FIG. 2, it is contemplated that the start frequency $f_{START}$ and stop frequency $f_{STOP}$ may vary within a radar frame or across multiple radar frames. A local oscillator signal $S_{LO}(t)$ is used to generate the RF signal $S_{RF}(t)$. Thus, it can be said that the local oscillator signal $S_{LO}(t)$ and the RF signal $S_{RF}(t)$ are frequency-modulated ramp signals that are generated within an operating frequency range (e.g., a predefined radar frequency range). For example, the local oscillator signal $S_{LO}(t)$ is a frequency-modulated ramp signal that includes a plurality of frequency ramps each starting at a respective ramp start frequency and ending at a respective ramp stop frequency and the respective ramp start frequencies and the respective ramp stop frequencies of the plurality of frequency ramps define a frequency range within the bounds of the operating frequency range. The frequency range of the plurality of frequency ramps is defined by the lowest start frequency $f_{START}$ and the highest stop frequency $f_{STOP}$ among the frequency ramps in a given time interval. As noted above, the start frequency $f_{START}$ and the stop frequency $f_{STOP}$ of a sequence of frequency ramps may be the same and thus the center frequency of each ramp may be constant. Alternatively, the center frequency of each ramp (and therefore $f_{START}$ and $f_{STOP}$) may vary from ramp to ramp or after detecting an interference. The bandwidth (i.e., frequency range) of each ramp may also vary from ramp to ramp or after detecting an interference FIG. 3 is a block diagram that illustrates an exemplary structure of a radar device 1 (radar sensor). It is noted that a similar structure may also be found in RF transceivers used in other applications such as, for example, in wireless communications systems. Accordingly, at least one transmission antenna 5 (TX antenna) and at least one reception antenna 6 (RX antenna) are connected to an RF frontend 10, which may be integrated in a monolithic microwave integrated circuit (MIMIC) 100.

The RF frontend 10 may include all the circuit components needed for RF signal processing. Such circuit components may (but need not necessarily) include, for example, a local oscillator (LO), RF power amplifiers, low noise amplifiers (LNAs), directional couplers such as rat-race-couplers and circulators, and mixers for the down-conversion (demodulation) of RF signals (e.g., the received signal $y_{RF}(t)$, see FIG. 1) into the baseband or an intermediate frequency (IF) band.

It is noted that antenna-arrays may be used instead of single antennas. The depicted example shows a bistatic (or pseudo-monostatic) radar system which has separate RX and TX antennas. In the case of a monostatic radar system, a single antenna or a single antenna array may be used to both receive and transmit electromagnetic (radar) signals. In this case, a directional coupler (e.g., a circulator) may be used to separate RF signals to be transmitted to the radar channel from RF signals received from the radar channel. In practice, radar systems often include several transmission (TX) and reception (RX) channels, which among others allows the measurement of the direction (direction of arrival (DoA)), from which the radar echoes are received.

In the case of a FMCW radar system, the transmitted RF signals radiated by the TX antenna 5 are in the range between approximately 20 GHz and 100 GHz (e.g., in the frequency band 21 to 26 GHz or in the frequency band 76 to 81 GHz). As mentioned, the RF signal $y_{RF}(t)$ received by the RX antenna 6 includes the radar echoes, i.e., the signal back-scattered at the so-called radar targets.

The received RF signals $y_{RF}(t)$ are down-converted into the baseband (IF band) and further processed in the baseband using analog signal processing (see FIG. 3, baseband signal processing chain 20), which basically includes filtering and amplification of the baseband signal. The baseband signal may also be referred to as analog radar data. It will be appreciated that if the received RF signals are down-converted into the IF band, the baseband signal processing chain 20 may be referred to as an IF signal processing chain. Thus, the analog baseband signal processing chain 20, in general, may also be referred to as an analog signal processing chain 20. The baseband signal is finally digitized using one or more analog-to-digital converters (ADC) 30 and further processed in the digital domain (see FIG. 3, digital signal processing chain implemented, e.g., in digital signal processor (DSP) 40). Thus, the ADC 30 is configured to generate a digital signal y(k) from the down-converted baseband signal.

The RF frontend 10 and the analog baseband signal processing chain 20 may be integrated in a single MMIC 100. Optionally, the ADC 30 may also be integrated in the MMIC 100 and outputs the digital signal y(k) to the DSP 40 for further processing. The ADC 30 may part of a digital front end (DFE) circuit of the MMIC 100 that includes additional circuitry that performs digital processing on the digital signal before outputting the digital signal y(k) from the MMIC 100 as the digital radar data.

The digital signal y(k) is representative of the radar data received in the RF signal $y_{RF}(t)$ and is further output from the digital data output terminal DOUT as a digital output signal, and provided to the DSP 40 that is external to the MMIC 100.

The overall system is controlled by a system controller 50 (e.g., a microcontroller), which may be at least partly implemented using a processor executing appropriate firmware. The processor may be included, e.g., in a microcontroller, a digital signal processor, or the like. The DSP 40 may be part of the system controller 50 or separate therefrom. The signal processor and system controller may be integrated in an application specific integrated circuit (ASIC). The DSP 40 may be configured to receive the digital radar data in the digital signal y(k) and process the digital radar data using the ramp parameters (e.g. respective ramp start frequencies, the respective ramp stop frequencies, a bandwidth of the first frequency range, a ramp start time, or a sampling start time) used to generate the respective frequency ramps of the RF signal $y_{RF}(t)$ in order to generate a range doppler map, which may then be further used by the DSP 40 for object detection, classification, and so on.

While the RF frontend 10 and the analog baseband signal processing chain 20 (and optionally the ADC 30) may be integrated in a single MMIC, the components shown in FIG. 3 may be distributed among two or more integrated circuits. Particularly, some parts of the digital signal processing may be done in the MMIC 100.

Figure 4:
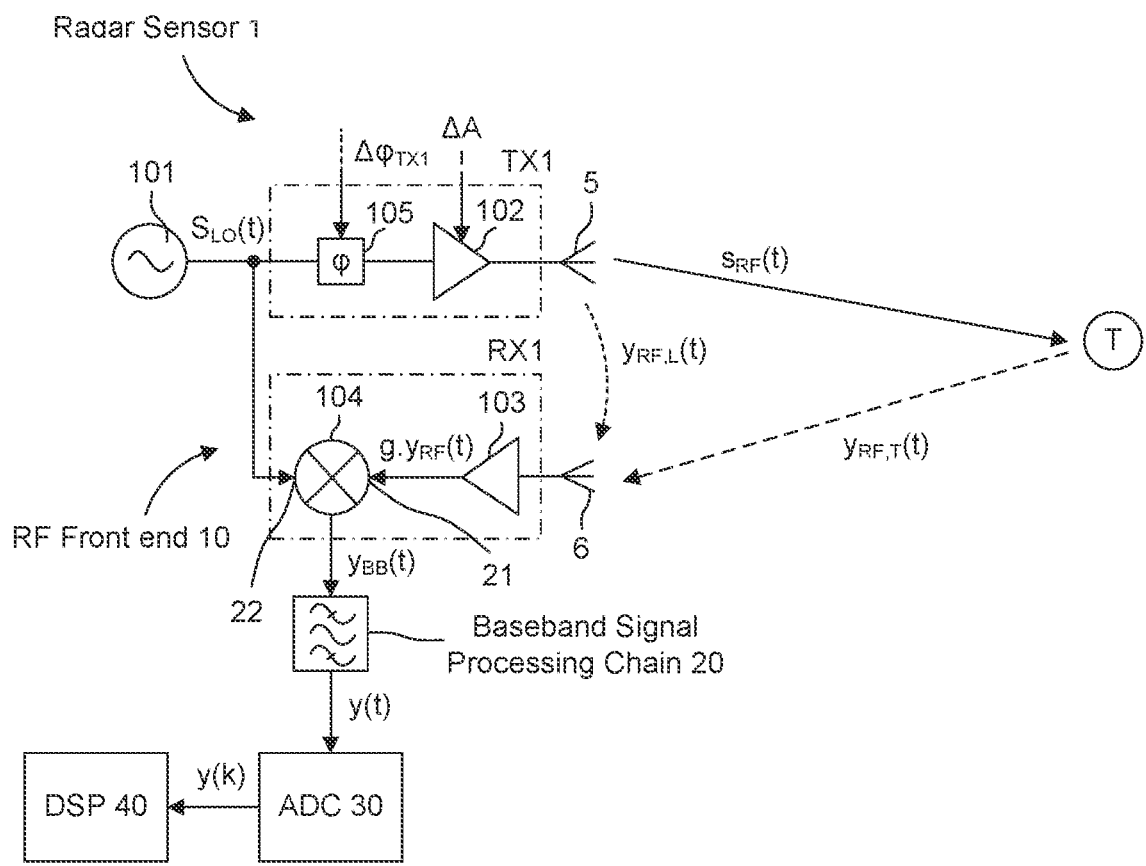
FIG. 4 is a circuit diagram to illustrate a simplified example of a radar transceiver, in particular of the RF front end of a radar transceiver, according to one or more embodiments.

FIG. 4 illustrates an exemplary implementation of a radar transceiver 1 in accordance with the example from FIG. 3 in more detail. In the present example, in particular the RF front end 10 of the radar transceiver 1 is depicted. It should be noted that FIG. 4 depicts a simplified circuit diagram in order to show the basic structure of the RF front end 10 with a transmission channel (TX channel TX1) and a reception channel (RX channel RX1). As mentioned, actual implementations, which can be highly dependent on the specific application, are usually more complex and have multiple TX and/or RX channels, which can also be integrated in different MMICs. Thus, the notation TXi is to indicate the ith TX channel out of N TX channels, where N is any integer. Similarly, the notation RXj is to indicate the jth RX channel out of M RX channels, where M is any integer.

The RF front end 10 comprises a local oscillator (LO) 101 that generates an RF oscillator signal $S_{LO}(t)$. The RF oscillator signal $S_{LO}(t)$ is frequency-modulated during operation—as described above with reference to FIG. 2—and is also referred to as LO signal, an input RF signal, or a reference signal. In radar applications, the LO signal is usually in the super high frequency (SHF) or extremely high frequency (EHF) band, e.g., in the range from 76 GHz to 81 GHz in a good many automotive applications. A fair number of radar systems operate in the 24 GHz industrial, scientific and medical (ISM) band as well. The LO signal may also be generated at a lower frequency and then up-converted using frequency multiplication units.

While the local oscillator 101 may be provided on chip, the local oscillator 101 may also be provided external thereto. For example, the LO signal may be provided by an external local oscillator and the LO signal may be provided to MMIC 100 by another MMIC in a master/slave relationship. In particular, MMIC 100 may be part of a MIMO radar system comprising a plurality of coupled (cascaded) MMICs in which one of the MMIC is configured as a master MMIC and the remaining MMIC are configured as slave MMICs. Each of the MMICs may include a local oscillator (LO) that generates an RF oscillator signal $S_{LO}(t)$. However, for the operation of the MIMO radar system, it is beneficial for LO signals used by the MMICs to be coherent. Therefore, the LO signal is generated in one MIMIC—the master MMIC—and a representation of the LO signal is distributed to the slave MMICs. The representation may for example be identical to the LO signal or the representation may be a frequency-divided signal which is then reconstructed at each MMIC by frequency multiplication. While in the following, a distribution of the LO signal will be described, it is to be understood that the following may also be applied to a frequency-divided distribution of the LO signal. In some embodiments, the master MMIC could also use the LO signal to feed itself via a signal loop to ensure the LO signal is equally delayed between the master and the slave MMICs.

The LO signal $S_{LO}(t)$ is processed both in the transmission signal path TX1 (in the TX channel) and in the received signal path RX1 (in the RX channel). The transmission signal $S_{RF}(t)$ (i.e., the outgoing radar signal) transmitted by the TX antenna 5 is generated by amplifying the LO signal $S_{LO}(t)$, for example, by means of a RF power amplifier 102, and is therefore an amplified and possibly phase-shifted version (see phase shifter 105) of the LO signal $S_{LO}(t)$. The transmission channel may also include a phase shifter 105 for applying a programmable phase shift p to the LO signal $S_{LO}(t)$. For example, the phase shifter 105 may be configurable by a phase control signal $\Delta\Phi TX$ and be used to manipulate the overall phase lag caused by the transmission channel. It is noted the magnitude or power level (i.e., gain) of the RF power amplifier 102 may also be programmable and adjustable by a gain control signal $\Delta A$.

Both the phase control signal ΔΦTX and the gain control signal ΔA may be set and adjusted by a controller of the MMIC 100 (e.g., controller 50). For example, by setting the power level of the RF power amplifier 102, the transmit power of the transmission channel may be set to a transmission power while the local oscillator 101 generates the LO signal $S_{LO}(t)$ with the frequency ramps intended to be transmitted as the transmission signal SRF(t) and received as back-scattered signal yRF(t) for the processing of radar data. The output of the amplifier 102 can be coupled to the TX antenna 5 (in the case of a bistatic/pseudo-monostatic radar configuration).

The received signal $y_{RF}(t)$ received by the RX antenna 6 is supplied to the receiver circuit in the RX channel and hence directly or indirectly to the RF port 21 of the mixer 104. In the present example, the RF received signal $y_{RF}(t)$ (antenna signal) is pre-amplified by means of the amplifier 103 with gain g. The mixer 104 thus receives the amplified RF received signal $g \cdot y_{RF}(t)$. The amplifier 103 can be, for example, a low-noise amplifier (LNA).

The reference port 22 of the mixer 104 is supplied with the LO signal $s_{LO}(t)$, so that the mixer 104 down-converts the (pre-amplified) RF received signal $y_{RF}(t)$ to the baseband (or the IF band). The down-converted baseband signal (mixer output signal) is denoted by $y_{BB}(t)$. This baseband signal $y_{BB}(t)$ is processed further in analog fashion by the analog baseband signal processing chain 20, substantially causing an amplification and a filtering (e.g. bandpass or high-pass filtering) in order to, for example, reject undesirable sidebands and image frequencies. The resulting analog output signal is denoted by y(t) and is supplied to an analog-to-digital converter (see FIG. 3, ADC 30). The ADC 30 converts the analog output signal y(t) into a digital output signal y[k] that undergoes further digital post-processing via a signal processor (e.g., DSP 40). Methods for further digital processing of the digitized output signal (digital radar signal y[k]) are known per se (e.g., Range Doppler Analysis) and are therefore not discussed in more detail herein.

In the present example, the mixer 104 down-converts the pre-amplified RF received signal $g \cdot y_{RF}(t)$ (i.e., the amplified antenna signal) to baseband. The conversion can take place in one stage (that is to say from the RF band directly to baseband) or via one or more intermediate stages (that is to say from the RF band to an intermediate-frequency band and on to baseband). In this case, the receiving mixer 104 effectively comprises multiple series-connected individual mixer stages. In addition, the mixer stage can contain an IQ mixer that generates two baseband signals (in-phase and quadrature signals) that can be interpreted as a real part and an imaginary part of a complex baseband signal.

As depicted in FIG. 4, the receiving antenna 6 of the reception channel RX1 receives a superimposition comprising the signal $y_{RF,T}(t)$ reflected from the target T and a direct crosstalk from the transmitting antenna 5, which is also referred to as leakage signal $y_{RF,L}(t)$. Reflections from an object situated right in front of the antennas (sometimes also called "blockers") are also referred to as crosstalk here and contribute in equal measure to the leakage signal. Both signals $y_{RF,T}(t)$ and $y_{RF,L}(t)$ are substantially delayed and attenuated versions of the output signal $s_{RF}(t)$ of the transmission channel TX1. The time delay between the output signal $s_{RF}(t)$ of the transmission channel TX1 and the received leakage signal $y_{RF,L}(t)$ (crosstalk) is relatively short (in comparison with the time delay of the echo signal $y_{RF,T}(t)$ from the target). In the normal radar mode, the leakage signal $y_{RF,L}(t)$ therefore causes a correspondingly low-frequency component in the baseband signal $y_{BB}(t)$, and this low-frequency component of the baseband signal $y_{BB}(t)$ is rejected in the baseband signal processing chain 20. For this purpose, the baseband signal processing chain 20 can have a bandpass filter or a high-pass filter having a suitable cut-off frequency.

Figure 5A:
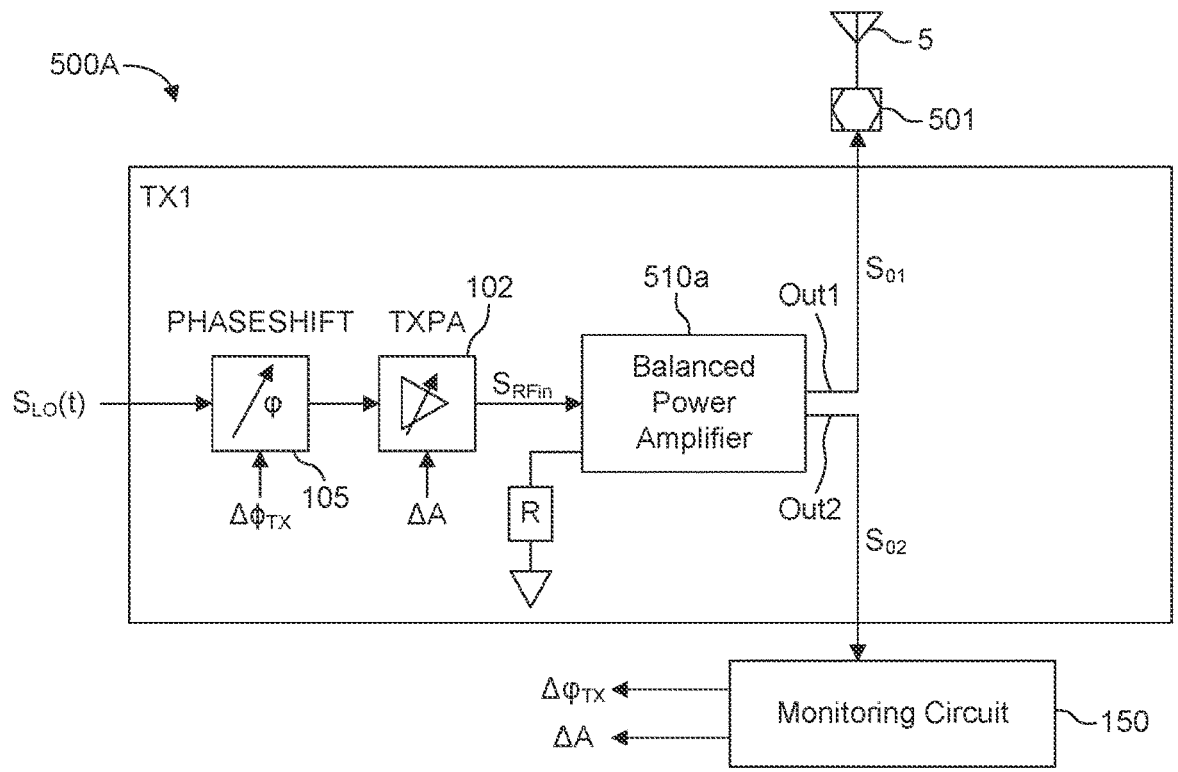
FIG. 5A illustrates schematic block diagram of a first RF circuit in accordance with one or more embodiments.

FIG. 5A illustrates schematic block diagram of an RF circuit 500A in accordance with one or more embodiments. The RF circuit 500A includes a transmission channel TX1 and monitoring circuit 150. The transmission channel TX1 is coupled to an RF output terminal 501 that is connected to an antenna 5. The transmission channel TX1 is also coupled to the monitoring circuit 150. The transmission channel TX1 includes the phase shifter 105 that receives an LO signal $S_{LO}(t)$ and a power amplifier 102 that amplifies the LO signal $S_{LO}(t)$ by a programmable gain to generate an RF input signal SRFin.

The transmission channel TX1 further includes a balanced power amplifier 510a that is configured to perform a power switch function between a first output signal S01 and a second output signal S02. In particular, the balanced power amplifier 510a is configured to steer output power between a first output port out1 of the transmission channel and a second output port out2 of the transmission channel. Said differently, the power of the RF input signal SRFin is output as either a first output signal S01 from the first output port out1 or a second output signal S02 from the second output port out2. Thus, the balanced power amplifier 510a can switchably generate either the first output signal S01 to be emitted by the antenna 5 or the second output signal S02 to be used as a monitoring signal by the monitoring circuit 150. The balanced power amplifier 510a performs this power switch function without coupler or switch power losses. The balanced power amplifier 510a is further coupled to a resistor R in order to operate properly.

The monitoring circuit 150 is configured to monitor multiple RF channels, including transmission (TX) channels and reception (RX) channels, by way of testing and analysis. For example, the monitoring circuit 150 may be configured to evaluate the phase and/or amplitude of each RF signal of each respective RF channel. The monitoring circuit 150 performs specific measurements on the monitoring signal S02 to detect faults or defective operation. The monitoring circuit 150 includes a control circuit configured to adjust the transmission phase setting A T TX of one or more transmission channels based on measured phase relationships between different TX channels and/or based on a measured phase relationship between a TX channel and the LO signal $S_{LO}(t)$.

For example, the monitoring circuit 150 may repeat a phase measurement for all TX channels, yielding NTx phase values, where NTx is the number of transmit channels. Comparing these NTx phase values allows for TX phase calibration by the control circuit by adjusting the phase shifters 105 in the individual RF TX paths properly. The phase measurement can also be performed for the LO signal $S_{LO}(t)$.

Additionally, the monitoring circuit 150 may measure an amplitude of the monitoring signal S02 and adjust the gain of the power amplifier 102 if the amplitude deviates from an expected value or range.

The control circuit of the monitoring circuit 150 may include a digital signal processor (DSP) or other type of processor that performs an FFT analysis for evaluating the phase and/or amplitude of the digitized mixer output signal. For example, the control circuit may be representative of a controller or control unit which may include, for example, a programmable processor such as an (e.g., embedded) microcontroller or a similar device. The functions provided by the control circuit may be (e.g., fully or partly) provided by the system controller 50 (see FIG. 3). Additionally, or alternatively, the functions provided by the control circuit may be at least partly provided by the DSP 40 (see FIG. 3). As such, the control circuit represents a portion of the functions of the system controller 50 and/or the DSP 40.

The control circuit may process the phase differences to perform phase balancing between RF channels, for example, based on determined phase relationships or may transmit the phase differences or phase relationship information to a system controller 50, which in turn provides control information to the control circuit for performing phase balancing between RF channels. The control circuit is configured to transmit compensated phase information to a phase shifter 105 of a transmission channel in order to control and adjust a phase shift A T TX implemented by the phase shifter 105.

Figure 5B:
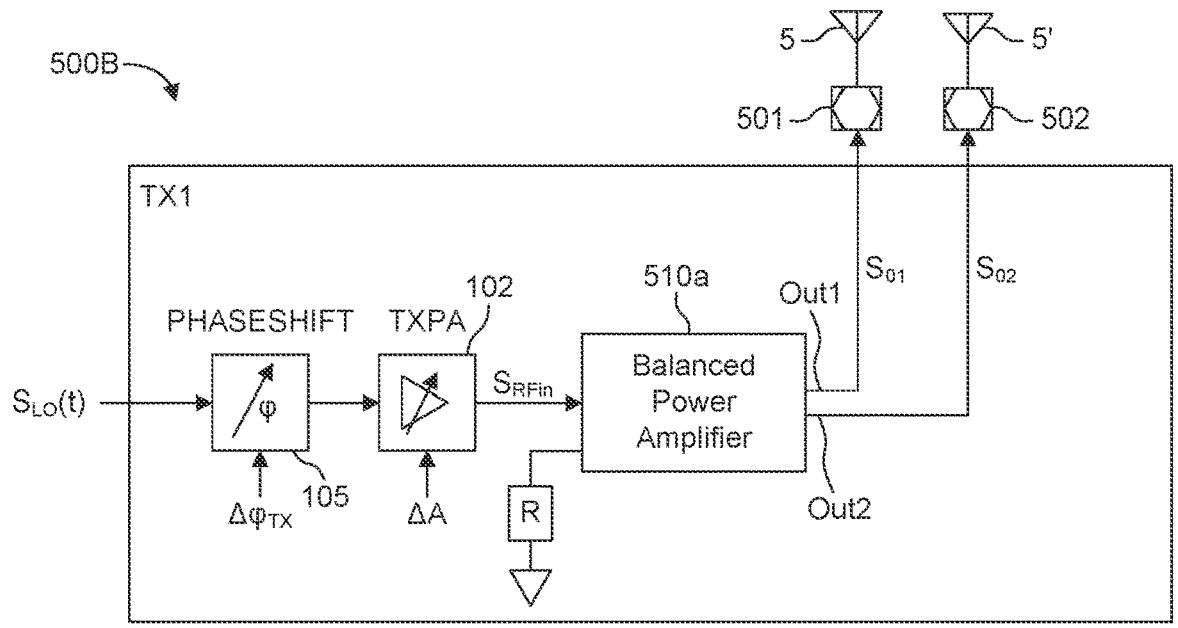
FIG. 5B illustrates schematic block diagram of a second RF circuit in accordance with one or more embodiments.

FIG. 5B illustrates schematic block diagram of an RF circuit 500B in accordance with one or more embodiments. The RF circuit 500B is similar to RF circuit 500A with the exception that the second output port out2 of the balanced power amplifier 510a is coupled to a second RF output terminal 502 that is connected to another antenna 5'. Because the balanced power amplifier 510a is configured to steer output power between the first output port out1 of the transmission channel and the second output port out2 of the transmission channel, the balanced power amplifier 510a can switchably generate either the first output signal S01 to be emitted by the antenna 5 or the second output signal S02 to be emitted by the other antenna 5'. This switching function can be used to provide antenna diversity in order to support multiple antennas by a single transmission channel, saving on total chip area. The two antennas 5 and 5' may have different transmission characteristics. For example, antenna 5 may be a long range antenna and antenna 5' may be a short range antenna.

Figure 5C:
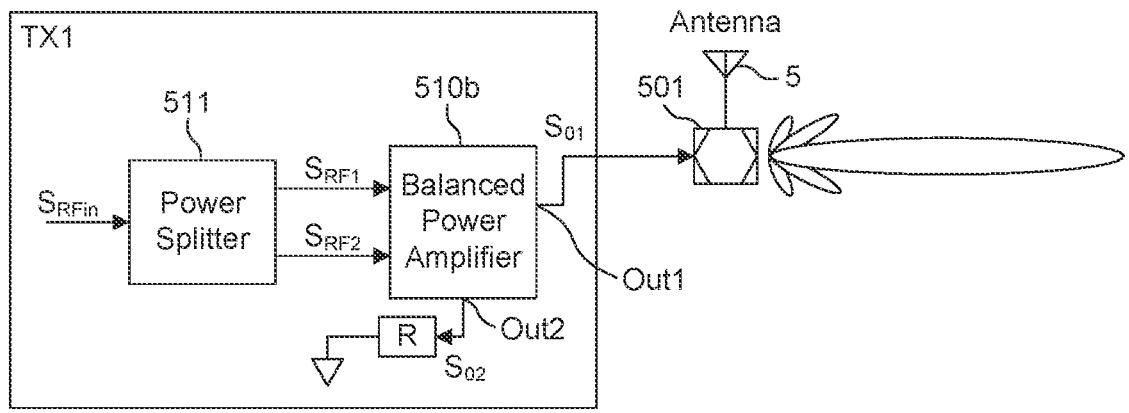
FIG. 5C illustrates schematic block diagram of a third RF circuit in accordance with one or more embodiments.

FIG. 5C illustrates schematic block diagram of an RF circuit 500C in accordance with one or more embodiments. The transmission channel TX1 includes a power splitter 511 that receives the input RF signal SRFin from, for example, the power amplifier 102, and splits the input RF signal SRFin equally into two portions—a first RF signal SRF1 and a second RF signal SRF2. The transmission channel TX1 further includes a balanced power amplifier 510b that can perform an IQ modulation function but no switch function.

When configured as an IQ modulator-power amplifier, the signal power of the second output signal 502 is always different than 0 and therefore must be dumped on chip to be able to set an arbitrary output phase. An on-chip resistor R may be used to provide a path for dumping the power of the second output signal S02. In other embodiments, a monitoring circuit 150 can be used instead of the resistor R.

Alternatively, the balanced power amplifier 510b can also be used to perform offset quadrature phase-shift keying (OQPSK) modulation, which can be used to modulate a phase of the first output signal S01 with offset quadrature phase-shift keying (OQPSK) modulation. In particular, in OQPSK mode the balanced power amplifier 510b can steer a phase of the first output signal S01 between 0°, 90°, 180°, and 270° relative phases.

Figure 5D:
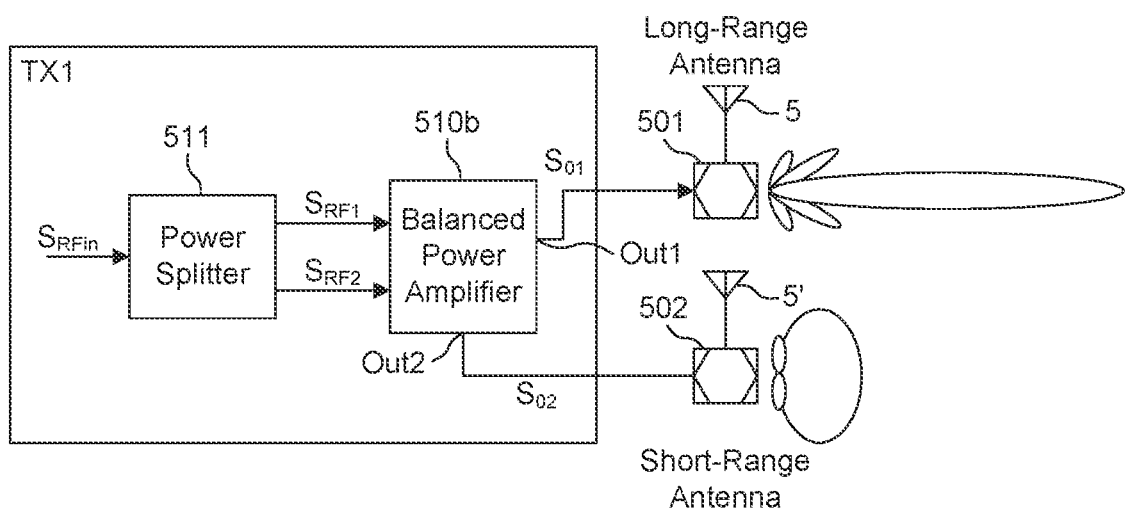
FIG. 5D illustrates schematic block diagram of a fourth RF circuit in accordance with one or more embodiments.

FIG. 5D illustrates schematic block diagram of an RF circuit 500D in accordance with one or more embodiments. Here, the second output out2 of the balanced power amplifier 510b is connected to a second antenna 5' instead of a resistor R. Again, the balanced power amplifier 510b can be operated in OQPSK mode. However, while operating in OQPSK mode, the balanced power amplifier 510b may be configured to work as a power switch to perform a similar function described above with respect to the balanced power amplifier 510a. Thus, when the balanced power amplifier 510b is set into OQPSK mode, the second output terminal 502 can be coupled to a second antenna 5' or to the monitoring circuit 150, whichever the case may be, instead of resistor R. The system controller 50 may control the operating mode of the balanced power amplifier 510b and thus steer the OQPSK modulated output power flow among first and second outputs dynamically, based on the application requirements.

Figure 6:
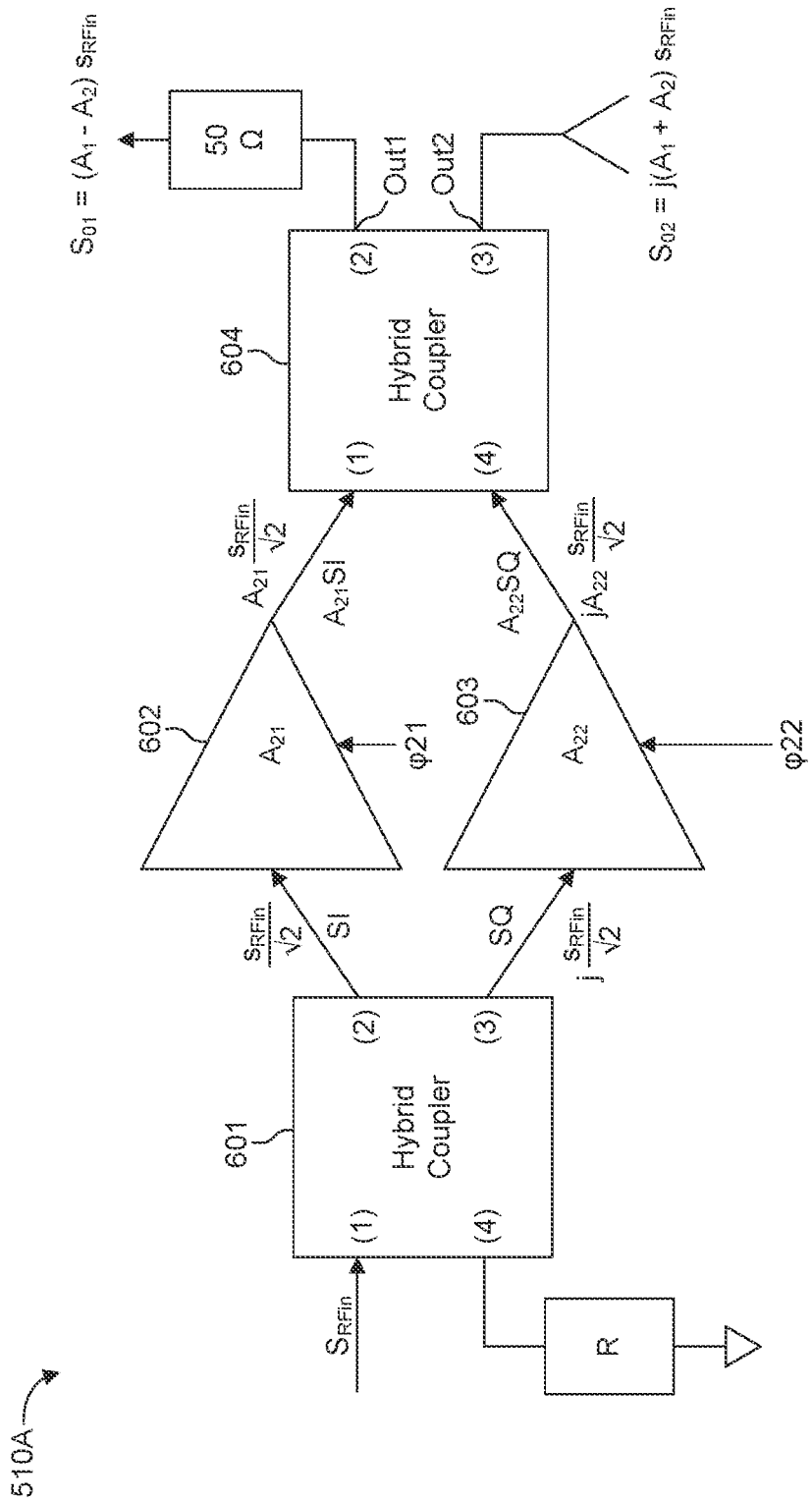
FIG. 6 is a schematic block diagram of a first balanced power amplifier according to one or more embodiments.

FIG. 6 is a schematic block diagram of the balanced power amplifier 510a according to one or more embodiments. The balanced power amplifier 510a includes a first 90° hybrid coupler 601, a first power amplifier 602 configured with a first voltage gain A21, a second power amplifier 603 configured with a second voltage gain A22, and a second 90° hybrid coupler 604.

The 90° hybrid couplers 601 and 604 each include four ports, including input port (1), a transmitted port (2), a coupled port (3), and an isolated port (4). The input port is used as an input terminal for both 90° hybrid couplers 601 and 604. Likewise, the transmitted ports and the coupled ports are both used as output terminals for both 90° hybrid couplers 601 and 604. The isolated port, however, is used as an output terminal for the first 90° hybrid coupler 601 and is used as an input terminal for the second 90° hybrid coupler 604.

The 90° hybrid couplers 601 and 604 are configured to split each of its input signals equally between two output ports (i.e., I/Q outputs), for example, by an attenuation of 3 dB. An attenuation of 3 dB corresponds to cutting the power of a signal in half. The signals at the outputs of a 90° hybrid coupler have a 90-degree phase difference between them.

For 90° hybrid coupler 601, the I-port (2), also known as "second port", "through port", or "transmitted port" by those skilled in the art, is in-phase with respect to the first input port (1), where SRFin is connected. The Q-port (3), also known as "third port" or "coupled port" by those skilled in the art, is in quadrature with respect to the first input port (1), where SRFin is connected. This type of coupler is also known as a quadrature coupler. In other words, the output signals derived from the same input signal are in quadrature with each other, with one output signal being in phase with the input signal and the other output signal being shifted 90 degrees from the input signal and both with half the power thereof. In this case, 90° hybrid coupler 601 generates two output signal SI and SQ as intermediate signals. Intermediate signal SI has an equivalent value of $s_{RFin}/\sqrt{2}$ and intermediate signal SQ has an equivalent value of $s_{RFin}/\sqrt{2}$, where j denotes a 90° phase shift relative to the intermediate signal SI.

For 90° hybrid coupler 604, its I-port (2) (i.e., out1) is in-phase with respect to its first input port (1), where A21SI is connected, and in quadrature with respect to its second input port (4), where A22SQ is connected. The Q-port (3) (i.e., out2) of the 90° hybrid coupler 604 is in-phase with respect to its second input port (4), where A22SQ is connected, and in quadrature with respect to the first input port (1), where A21SI is connected. This type of coupler is also known as a quadrature coupler. In other words, the output signals derived from the same input signal are in quadrature with each other, with one output signal being in phase with the input signal and the other output signal being shifted 90 degrees from the input signal and both with half the power thereof. As will be explained in further detail below, the phases of amplified signals A21SI and A22SQ are set or calibrated in a way that the first output signal S01 is equal to (A21−A22)SRFin and the second output signal S02 is equal to j(A21+A22)SRFin.

When a phase of a voltage gain is the first phase (e.g., 0°), the voltage gain can be assigned a positive value and, when a phase of a voltage gain is the second phase (e.g., 180°), the voltage gain can be assigned a negative value. Due to the nature of the phase calibration and due to the magnitudes of the gains being substantially matched, one of (A21−A22) or (A21+22) will be equal to or substantially equal to zero, meaning that the output power of one of the output signals S01 or S02 will be zero. The phase relationships can be switchably controlled to be either 0° (or an arbitrary phase A°) or 180° (or A°+180°) such that the output of the second 90° hybrid coupler 604 can be switched between the two output signals S01 and S02.

The 50 ohm resistor provided in the signal path of output signal S01 is representative of either an antenna 5, the monitoring circuit 150, or resistor R. The actual resistive value here is arbitrary and is not intended to be limiting. The 50 ohm resistor could alternatively be provided in the signal path of output signal S02 to represent the option of having the output signal S02 connected to an antenna, a monitoring circuit, or a resistor R.

The first power amplifier 602 includes a first control input for receiving a first phase control signal φ21. The first power amplifier 602 is configured to receive the first intermediate signal SI and apply the first voltage gain A21 to the first intermediate signal SI to generate a first amplified signal A21SI. The first voltage gain A21 is a complex number that has a first predetermined (fixed) magnitude and a first programmable phase adjustable by the first phase control signal φ21. The first phase control signal φ21 is configured to set the first programmable phase to either a first phase (A°) or to a second phase that is 180° phase shifted relative to the first phase. For example, the first phase may be 0° and the second phase may be 180°.

The second power amplifier 603 includes a second control input for receiving a second phase control signal φ22. The second power amplifier 603 is configured to receive the second intermediate signal SQ and apply a second voltage gain A22 to the second intermediate signal SQ to generate a second amplified signal A22SQ. The second voltage gain A22 is a complex number that has a second predetermined (fixed) magnitude and a second programmable phase adjustable by the second phase control signal φ22. The second phase control signal φ22 is configured to set the second programmable phase (B°) to either the first phase (e.g., 0°) or to the second phase that is 180° phase shifted relative to the first phase.

The preconfigured magnitudes of the first and second voltage gains A21 and A22 are matched or substantially matched (i.e., equal or substantially equal). In addition, the initial phase of both voltage gains A21 (A°) and A22 (B°) are matched or substantially matched. That is, both voltage gains are toggled exclusively between the same two phases. As a result, the two voltage gains A21 and A22 are configured to be in-phase with each other (i.e., both are A°+0° or both are A°+180°) or the two voltage gains A21 and A22 are configured to be out-of-phase with each other (i.e., one is set to 0° and the other is set to 180°).

A total gain of the first output signal out1 is equal to a difference of the first gain A21 and the second gain A22 and a total gain of the second output signal out2 is equal to a sum of the first gain A21 and the second gain A22, phase shifted by 90°. This means that when the two voltage gains A21 and A22 are out-of-phase, the two complex gains cancel each other out at the second output port out2 and the output power of the second output signal S02 is zero. In contrast, at the first output port out1, the two complex gains are constructively added together such that the output power of the first output signal S01 is twice A21 or twice A22 (since A21 and A22 have the same magnitude). Thus, the first output port out1 is selected to output the first output signal S01 and the second output port out2 outputs no or very little signal.

When the two voltage gains A21 and A22 are in-phase, the opposite occurs. The two complex gains cancel each other out at the first output port out1 and the output power of the first output signal S01 is zero. In contrast, at the second output port out2, the two complex gains are constructively added together such that the output power of the second output signal S02 is twice A21 or twice A22 (since A21 and A22 have the same magnitude). Thus, the second output port out2 is selected to output the second output signal S02 and the first output port out1 outputs no or very little signal.

Accordingly, the second 90° hybrid coupler 604 is configured to generate and output the first output signal S01 based on a combination of the first amplified signal A21SI and the second amplified signal A22SQ when the first programmable phase and the second programmable phase are 180° out-of-phase, and generate and output the second output signal S02 based on a combination of the first amplified signal A21SI and the second amplified signal A22SQ when the first programmable phase and the second programmable phase are in-phase. The power of the first output signal S01 is substantially zero when the first programmable phase and the second programmable phase are set to be in-phase, and the power of the second output signal S02 is substantially zero when the first programmable phase and the second programmable phase are set to 180° out-of-phase.

When selected for output, the first output signal out1 is equal to the input RF signal SRFin multiplied by a sum of the first gain A21 and the second gain A22, wherein a phase of the first output signal out1 is in-phase with a phase of the input RF signal SRFin. When selected for output, the second output signal S02 is equal to the input RF signal SRFin, 90° phase shifted relative to a phase of the input RF signal SRFin, and multiplied by a sum of the first gain A21 and the second gain A22. The system controller 50 may be configured to generate the phase control signals φ21 and φ22 in order to control the switching function of the balanced power amplifier 510 to selectively steer the power of the input RF signal SRFin to one of the RF outputs out1 and out2. By doing so, the system controller 50 uses the balanced power amplifier to both amplify the input RF signal SRFin while steering output power between the first output port out1 and the second output port out2. In this way, output signals out1 and out2 are selectively output from the balanced power amplifier.

Figure 7:
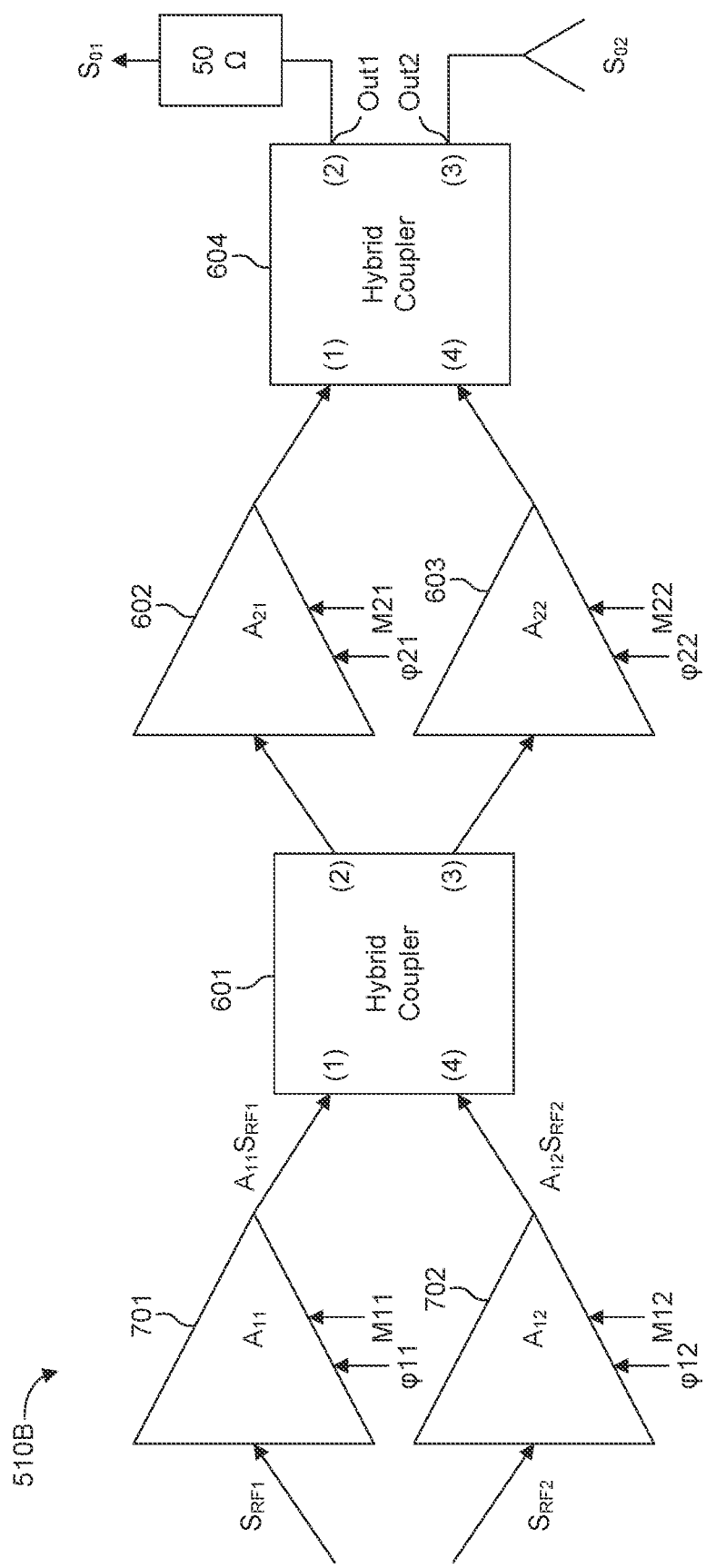
FIG. 7 is a schematic block diagram of a second balanced power amplifier according to one or more embodiments.

FIG. 7 is a schematic block diagram of the balanced power amplifier 510b according to one or more embodiments. The balanced power amplifier 510b includes the first 90° hybrid coupler 601, a first power amplifier 602 configured with the first voltage gain A21, a second power amplifier 603 configured with the second voltage gain A22, and the second 90° hybrid coupler 604. In addition, the balanced power amplifier 510b includes an additional programmable input stage that enables IQ modulation to be implemented, saving silicon area and power consumption when compared to a full-blown IQ modulator architecture.

The additional programmable input stage includes a third power amplifier 701 and a fourth power amplifier 702 arranged in parallel to each other and coupled to the input ports (1) and (4) of the first 90° hybrid coupler. Here, the isolated port (4) of the first 90° hybrid coupler is used as an input port instead of an output port.

The third power amplifier 701 includes a third control input for receiving a third phase control signal $\varphi 11$ and a fourth control input for receiving a first magnitude control signal M11. The third power amplifier 701 is configured to receive a first portion SRF1 of the input RF signal SRFin and apply a third voltage gain A11 to the first portion SRF1 to generate an RF signal A11SRF1. The third voltage gain A11 is a complex number having a first programmable magnitude adjustable by the first magnitude control signal M11 and a third programmable phase adjustable by the third phase control signal $\varphi 11$. The first magnitude control signal M11 is configured to set the first programmable magnitude to either zero or to a third predetermined magnitude. In other words, the first magnitude control signal M11 toggles the magnitude of the third voltage gain A11 exclusively between these two values. The third phase control signal $\varphi 11$ is configured to set the third programmable phase to either the first phase or to the second phase that is 180° phase shifted relative to the first phase. For example, the first phase may be 0° and the second phase may be 180°.

The fourth power amplifier 702 includes a fifth control input for receiving a fourth phase control signal $\varphi 12$ and a sixth control input for receiving a second magnitude control signal M12. The fourth power amplifier is configured to receive a second portion SRF2 of the input RF signal SRFin and apply a fourth voltage gain A12 to the second portion SRF2 of the input RF signal to generate an RF signal A12SRF2. The fourth gain A12 is a complex number having a second programmable magnitude adjustable by the second magnitude control signal M12 and a fourth programmable phase adjustable by the fourth phase control signal $\varphi 12$. The second magnitude control signal M12 is configured to set the second programmable magnitude to either zero or to a fourth predetermined magnitude. In other words, the second magnitude control signal M12 toggles the magnitude of the fourth voltage gain A12 exclusively between these two values. The third and the fourth predetermined magnitudes maybe matched or substantially matched. The fourth phase control signal $\varphi 12$ is configured to set the fourth programmable phase to either the first phase (e.g., 0°) or to the second phase that is 180° phase shifted relative to the first phase.

In addition, the initial phase of both voltage gains A11 and A12 are matched or substantially matched. That is, both voltage gains are toggled between the same two phases. As a result, the two voltage gains A11 and A12 are configured to be in-phase with each other (i.e., both are 0° or both are 180°) or the two voltage gains A11 and A12 are configured to be out-of-phase with each other (i.e., one is set to 0° and the other is set to 180°).

The configurability of the programmable magnitudes of the two voltage gains A11 and A12 allows the system controller 50 to select whether the first 90° hybrid coupler receives RF signal A11SRF1, RF signal A12SRF2, or both. In order to perform full IQ modulation both the first programmable magnitude M11 and the second programmable magnitude M12 should be set to a value different than zero. M11 and M12 can be matched or different for full IQ modulation. In this embodiment, the output signals S01 and S02 are represented by Equations 1-3.

$$S01=\{A11(A21-A22)SRF1+jA12(A21+A22)SRF2\} \quad \text{Eq. (1),}$$

$$S02=\{jA11(A21+A22)SRF1+A12(A22-A21)SRF2\} \quad \text{Eq. (2),}$$

$$SRF1=SRF2 \quad \text{Eq. (3).}$$

Full IQ modulation can be performed in the context of FIG. 5C, wherein the power of the second output S02 is dumped to an internal resistor R. In this case, the first power amplifier 602 includes seventh control input for receiving a third magnitude control signal M21 and the second power amplifier 603 includes an eighth control input for receiving a fourth magnitude control signal M22. The magnitude control signals M21 and M22 enable the magnitude component of voltage gains A21 and A22 to be programmable, respectively. Output signal S01 can therefore be represented by any complex number according to Equation 1. In other words, output signal S01 can be steered to have any IQ modulation vector over a full range of IQ modulation vectors. This is achieved by setting the magnitude control signals M11 and M12 to a magnitude value greater than zero, setting the phase values of control signals $\varphi 21$ and $\varphi 22$ to either 0° or 180°, and setting the magnitude values of control signals M21 and M22 to any magnitude value between 0 and a maximum preconfigured value. The key advantage is full IQM can be achieved by only changing a magnitudes M11, M12, M21, and M22 and by changing phases $\varphi 21$ and $\varphi 22$ to be either 0° or 180° phase shifted from each other to be able to produce positive or negative vector values. For full IQ modulation, the magnitude values of control signals M21 and M22 can be the same or different depending on the desired IQ modulation vector to be achieved. This flexibility in both programmable phase and programmable magnitude for both voltage gains A21 and A22 is what enables the balanced power amplifier 510b to steer output signal S01 over a full range of IQ modulation vectors for performing full IQ modulation in accordance with Equation 1 with an architecture which is particularly suitable for high performance implementations at millimeter waves (mmW) (i.e., electromagnetic radio waves).

When no constraints are applied to the A21 and A22 voltage gains it is apparent from Equations 1-3 that a full IQ modulation is possible. As an example, S01 can output any complex output voltage value, i.e., covering any phase and magnitude. This requires however that at least A21 and A22 must be able to assume any possible magnitude value while being matched in initial phase. This means the phase of A21 can be either A° or A°+180° (depending on $\varphi 21$ setting), the phase of A22 can be either B° or B°+180° (depending on $\varphi 22$ setting) and A=B. Hence, full IQ modulation can be achieved without the need for an accurate phase shifter. Instead, phases $\varphi 21$ and $\varphi 22$ can be switched to be in-phase or 180° out-of-phase and the magnitudes of A21 and A22 can be finely adjusted to obtain any IQM vector. Also, as a consequence, it is apparent that 502 will also show a complex output voltage correlated to (phase shifted compared to) 501. For practical applications this second output power will be dumped on-chip in a resistor R or to a monitoring circuit 150.

Instead of full IQ modulation, it is apparent that OQPSK modulation can be applied to the first output signal 501 in line with FIG. 5D by switchably setting one of the magnitudes of the voltage gains A11 and A12 to zero. For example, when the magnitude of A12 is set to zero, the magnitude of A11 is set to its predetermined (non-zero) magnitude value, and A21=−A22 (i.e., the phases of A21 and A22 are out-of-phase and magnitudes of A21 and A22 are matched), the following becomes true:

$$S01=\{\pm|A11|2\cdot A21)\}SRF1$$

$$S02=0 \quad \text{Eq. (4).}$$

The sign the first output signal S01 depends on the phase setting of the voltage gain A11. For example, when the phase of the voltage gain A11 is set to the first phase, first output signal S01 will be positive and the first output signal S01 can be said to have a 0° relative phase. When the phase of the voltage gain A11 is set to the second phase, first output signal S01 will be negative and the first output signal S01 can be said to have a 180° relative phase. In other words, switching the phase of voltage gain A11 when the magnitude of A12 is set to zero and when A21=−A22 causes the phase of the first output signal S01 to switch between a 0° phase and a 180° phase with respect to a reference phase. If the reference phase is 0°, for example, set by phase shifter 105, then the phase of the first output signal S01 will switch between a true 0° phase and a true 180° phase.

The output can be switched from output port out1 to output port out2 by setting the phases of A21 and A22 to be in-phase when A12=0 and the magnitudes of A21 and A22 are matched, with the sign the second output signal S02 dependent on the phase setting of the voltage gain A11.

$$S02=\{\pm|A11|2\cdot A21)\}SRF1$$

$$S01=0 \quad \text{Eq. (5).}$$

When the magnitude of A11 is set to zero, the magnitude of A12 is set to its predetermined (non-zero) magnitude value, and A21=A22 (i.e., the phases of A21 and A22 are equal and in-phase and magnitudes of A21 and A22 are matched), the following becomes true:

$$S01=\{\pm j|A12|2\cdot A21)\}SRF2$$

$$S02=0 \quad \text{Eq. (6).}$$

As indicated by the "j" in Equation 5, the terms of 501 from Equation 6 are phase shifted 90° with respect to the terms of 501 from Equation 4. The sign the first output signal 501 depends on the phase setting of the voltage gain A12. For example, when the phase of the voltage gain A12 is set to the first phase, first output signal 501 will be positive and the first output signal S01 can be said to have a 90° relative phase. When the phase of the voltage gain A12 is set to the second phase, first output signal S01 will be negative and the first output signal S01 can be said to have a 270° relative phase. In other words, switching the phase of voltage gain A12 when the magnitude of A11 is set to zero and when A21=A22 causes the phase of the first output signal S01 to switch between a 90° phase and a 270° phase with respect to a reference phase. If the reference phase is 0°, for example, set by phase shifter 105, then the phase of the first output signal S01 will switch between a true 90° phase and a true 270° phase.

The output can be switched from output port out1 to output port out2 by setting the phases of A21 and A22 to be out-of-phase when A11=0 and the magnitudes of A21 and A22 are matched, with the sign the second output signal S02 dependent on the phase setting of the voltage gain A12.

$$S02=\{\pm j|A12|2\cdot A21)\}SRF2$$

$$S01=0 \quad \text{Eq. (7).}$$

The control signals may be toggle bits that are toggled between a first bit value (e.g., 0) and a second bit value (e.g., 1) in order to switch the phase or the magnitude of the corresponding voltage gain between two programmed values. Accordingly, the system controller 50 can control the first phase control signal φ21, the second phase control signal φ22, the third phase control signal φ11, the fourth phase control signal φ12, the first magnitude control signal M11, and the second magnitude control signal M12 in order to steer an output phase of the first output signal S01 between 0°, 90°, 180°, and 270° relative phases. In other words, the system controller 50 generates the control signals to modulate an output phase of the first output signal with OQPSK modulation.

It is worth nothing that in Equations 4 and 6 output signal S02 is always zero and in Equations 5 and 7 output signal S01 is always zero, which means the balanced power amplifier 510b also offers a power switch function to steer output power between outputs out1 and out2 by correctly setting the control signals. For example, when the first programmable magnitude of A11 is set to the third predetermined magnitude by control signal M11, the second programmable magnitude of A12 is set to zero by control signal M12, and the first programmable phase of A21 and the second programmable phase of A22 are set in-phase, the second 90° hybrid coupler 604 is configured to generate and output the second output signal S02 based on a combination of the first amplified signal A21SI and the second amplified signal A22SQ. This set up causes the power of the first output signal S01 to be zero or substantially zero and the power of the second output signal S02 to be sufficient for transmission. This property is a consequence of the adopted control scheme and architecture.

Thus, the system controller 50 is configured to calibrate the first gain A21, in terms of the first predetermined magnitude and the first programmable phase, and the second gain A22, in terms of the second predetermined magnitude and the second programmable phase, in order to steer output power between the first output port and the second output port. Moreover, the system controller 50 is configured to calibrate the first gain A21, in terms of the first predetermined magnitude and the first programmable phase, the second gain A22, in terms of the second predetermined magnitude and the second programmable phase, the third gain A11, in terms of the first programmable magnitude and the third programmable phase, and the fourth gain A12, in terms of the second programmable magnitude and the fourth programmable phase, in order to steer output power between the first output port and the second output port while also implementing offset quadrature phase-shift keying (OQPSK) modulation.

In view of the above, the balanced power amplifier 510b is programmable into a full IQ modulation mode in line with FIG. 5C, into a OQPSK mode in line with FIG. 5D, and/or into a power switch mode in line with FIGS. 5A, 5B, and 5D by setting the phases and magnitudes of the complex voltage gains A11, A12, A21, and A22 appropriately for the desired mode.

While various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Instructions may be executed by one or more processors, such as one or more central processing units (CPUs), digital signal processors (DSPs), general purpose microprocessors, application specific integrated circuits (ASICs), field programmable logic arrays (FPGAs), or other equivalent integrated or discrete logic circuitry. Accordingly, the term "processor" or "processing circuitry" as used herein refers to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

Thus, the techniques described in this disclosure may be implemented, at least in part, in hardware, software, firmware, or any combination thereof. For example, various aspects of the described techniques may be implemented within one or more processors, including one or more microprocessors, DSPs, ASICs, or any other equivalent integrated or discrete logic circuitry, as well as any combinations of such components.

A controller including hardware may also perform one or more of the techniques described in this disclosure. Such hardware, software, and firmware may be implemented within the same device or within separate devices to support the various techniques described in this disclosure. Software may be stored on a non-transitory computer-readable medium such that the non-transitory computer readable medium includes a program code or a program algorithm stored thereon which, when executed, causes the controller, via a computer program, to perform the steps of a method.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized, and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A radio frequency (RF) circuit, comprising:
    a balanced power amplifier comprising:
        a first 90° hybrid coupler comprising a first RF input configured to receive a first RF signal, wherein the first 90° hybrid coupler is configured to generate a first intermediate signal based on the first RF signal and generate a second intermediate signal based on the first RF signal, wherein a phase of the second intermediate signal is 90° phase shifted relative to a phase of the first intermediate signal;
        a first power amplifier comprising a first control input for receiving a first phase control signal, wherein the first power amplifier is configured to receive the first intermediate signal and apply a first gain to the first intermediate signal to generate a first amplified signal, wherein the first gain has a first predetermined magnitude and a first programmable phase adjustable by the first phase control signal, wherein the first phase control signal is configured to set the first programmable phase to either a first phase or to a second phase that is 180° phase shifted relative to the first phase;
        a second power amplifier comprising a second control input for receiving a second phase control signal, wherein the second power amplifier is configured to receive the second intermediate signal and apply a second gain to the second intermediate signal to generate a second amplified signal, wherein the second gain has a second predetermined magnitude and a second programmable phase adjustable by the second phase control signal, wherein the second phase control signal is configured to set the second programmable phase to either the first phase or to the second phase that is 180° phase shifted relative to the first phase; and
        a second 90° hybrid coupler comprising a second RF input configured to receive the first amplified signal, a third RF input configured to receive the second amplified signal, a first output port configured to output a first output signal, and a second output port configured to output a second output signal,
        wherein the second 90° hybrid coupler is configured to generate and output the first output signal based on a combination of the first amplified signal and the second amplified signal when the first programmable phase and the second programmable phase are 180° out-of-phase, and generate and output the second output signal based on a combination of the first amplified signal and the second amplified signal when the first programmable phase and the second programmable phase are in-phase.

2. The RF circuit of claim 1, wherein:
    a power of the first output signal is substantially zero when the first programmable phase and the second programmable phase are set to be in-phase, and
    a power of the second output signal is substantially zero when the first programmable phase and the second programmable phase are set to be 180° out-of-phase.

3. The RF circuit of claim 1, wherein:
    the first output signal is equal to the first RF signal multiplied by a difference of the first gain and the second gain, wherein a phase of the first output signal is in-phase with a phase of the first RF signal, summed to the phase of the first gain, and the second output signal is equal to the first RF signal, 90° phase shifted relative to a phase of the first RF signal, summed to the phase of the first gain, and multiplied by a sum of the first gain and the second gain.

4. The RF circuit of claim 1, wherein:
a total gain of the first output signal is equal to a difference of the first gain and the second gain and a total gain of the second output signal is equal to a sum of the first gain and the second gain.

5. The RF circuit of claim 1, wherein a phase of the second output signal is 90° phase shifted relative to a phase of the first output signal.

6. The RF circuit of claim 1, wherein the first predetermined magnitude and the second predetermined magnitude are substantially matched.

7. The RF circuit of claim 1, wherein:
the first output port is configured to be connected to a first antenna, and
the second output port is configured to be connected to a second antenna.

8. The RF circuit of claim 1, further comprising:
a monitoring circuit coupled to the second output port, wherein the monitoring circuit is configured to measure a property of the first output signal and determine an operating condition of the balanced power amplifier based on the measured property,
wherein the first output port is configured to be connected to an antenna.

9. The RF circuit of claim 1, further comprising:
a controller configured to generate the first phase control signal and the second phase control signal in order to steer output power between the first output port and the second output port.

10. The RF circuit of claim 1, further comprising:
a controller configured to calibrate the first gain, in terms of the first predetermined magnitude and the first programmable phase, and the second gain, in terms of the second predetermined magnitude and the second programmable phase, in order to steer output power between the first output port and the second output port.

11. The RF circuit of claim 1, further comprising:
a controller configured to generate the first phase control signal and the second phase control signal, wherein the controller is configured to switch the first phase control signal and the second phase control signal to be in-phase or to be 180° out-of-phase in order to selectively output either the first output signal or the second output signal from the second 90° hybrid coupler.

12. The RF circuit of claim 1, further comprising:
a local oscillator configured to generate the first RF signal.

13. The RF circuit of claim 1, wherein the balanced power amplifier further comprises:
a third power amplifier comprising a third control input for receiving a third phase control signal and a fourth control input for receiving a first magnitude control signal, wherein the third power amplifier is configured to receive a first portion of an input RF signal and apply a third gain to the first portion of the input RF signal to generate the first RF signal, wherein the third gain has a first programmable magnitude adjustable by the first magnitude control signal and a third programmable phase adjustable by the third phase control signal, wherein the first magnitude control signal is configured to set the first programmable magnitude to either zero or to a third predetermined magnitude, and wherein the third phase control signal is configured to set the third programmable phase to either the first phase or to the second phase that is 180° phase shifted relative to the first phase; and a fourth power amplifier comprising a fifth control input for receiving a fourth phase control signal and a sixth control input for receiving a second magnitude control signal, wherein the fourth power amplifier is configured to receive a second portion of the input RF signal and apply a fourth gain to the second portion of the input RF signal to generate a second RF signal, wherein the fourth gain has a second programmable magnitude adjustable by the second magnitude control signal and a fourth programmable phase adjustable by the fourth phase control signal, wherein the second magnitude control signal is configured to set the second programmable magnitude to either zero or to a fourth predetermined magnitude, and wherein the fourth phase control signal is configured to set the fourth programmable phase to either the first phase or to the second phase that is 180° phase shifted relative to the first phase,
wherein the first 90° hybrid coupler comprises a fourth RF input coupled to the fourth power amplifier and is configured to receive the second RF signal, and
wherein the first RF input of the first 90° hybrid coupler is coupled to the third power amplifier and is configured to receive the first RF signal.

14. The RF circuit of claim 13, wherein the third predetermined magnitude and the fourth predetermined magnitude are substantially matched.

15. The RF circuit of claim 13, wherein the first and the second predetermined magnitudes are substantially matched, and further comprising:
a controller configured to generate the first phase control signal, the second phase control signal, the third phase control signal, the fourth phase control signal, the first magnitude control signal, and the second magnitude control signal in order to steer an output phase of the first output signal between 0°, 90°, 180°, and 270° relative phases.

16. The RF circuit of claim 15, wherein, when the first programmable magnitude is set to the third predetermined magnitude, the second programmable magnitude is set to zero, and the first programmable phase and the second programmable phase are 180° out-of-phase, the output phase of the first output signal depends on the third programmable phase.

17. The RF circuit of claim 16, wherein:
when the first programmable magnitude is set to the third predetermined magnitude, the second programmable magnitude is set to zero, and the first programmable phase and the second programmable phase are 180° out-of-phase, the output phase of the first output signal depends on the third programmable phase according to:
when the third programmable phase is set to the first phase, the output phase of the first output signal is set to the 0° relative phase, and
when the third programmable phase is set to the second phase, the output phase of the first output signal is set to the 180° relative phase.

18. The RF circuit of claim 16, wherein, when the first programmable magnitude is set to zero, the second programmable magnitude is set to the fourth predetermined magnitude, and the first programmable phase and the second programmable phase are in-phase, the output phase of the first output signal depends on the fourth programmable phase.

19. The RF circuit of claim 18, wherein, when the first programmable magnitude is set to zero, the second programmable magnitude is set to the fourth predetermined magnitude, and the first programmable phase and the second programmable phase are in-phase, the output phase of the first output signal depends on the fourth programmable phase according to:
when the fourth programmable phase is set to the first phase, the output phase of the first output signal is set to the 90° relative phase, and
when the fourth programmable phase is set to the second phase, the output phase of the first output signal is set to the 270° relative phase.

20. The RF circuit of claim 13, further comprising:
a controller configured to generate the first phase control signal, the second phase control signal, the third phase control signal, the fourth phase control signal, the first magnitude control signal, and the second magnitude control signal in order to modulate an output phase of the first output signal with offset quadrature phase-shift keying (OQPSK) modulation.

21. The RF circuit of claim 20, wherein:
when the first programmable magnitude is set to the third predetermined magnitude, the second programmable magnitude is set to zero, and the first programmable phase and the second programmable phase are in-phase, the second 90° hybrid coupler is configured to generate and output the second output signal based on a combination of the first amplified signal and the second amplified signal and a power of the first output signal is substantially zero.

22. The RF circuit of claim 13, further comprising:
a local oscillator configured to generate the input RF signal.

23. The RF circuit of claim 13, further comprising:
a controller configured to calibrate the first gain, in terms of the first predetermined magnitude and the first programmable phase, the second gain, in terms of the second predetermined magnitude and the second programmable phase, the third gain, in terms of the first programmable magnitude and the third programmable phase, and the fourth gain, in terms of the second programmable magnitude and the fourth programmable phase, in order to steer output power between the first output port and the second output port while implementing offset quadrature phase-shift keying (OQPSK) modulation.

24. A radio frequency (RF) circuit, comprising:
a balanced power amplifier comprising:
a first power amplifier comprising a first control input for receiving a first phase control signal and a second control input for receiving a first magnitude control signal, wherein the first power amplifier is configured to receive a first portion of an input RF signal and apply a first gain to the first portion of the input RF signal to generate a first RF signal, wherein the first gain has a first programmable magnitude adjustable by the first magnitude control signal and a first programmable phase adjustable by the first phase control signal, wherein the first magnitude control signal is configured to set the first programmable magnitude according to an IQ modulation vector, and wherein the first phase control signal is configured to set the first programmable phase according to the IQ modulation vector;
a second power amplifier comprising a third control input for receiving a second phase control signal and a fourth control input for receiving a second magnitude control signal, wherein the second power amplifier is configured to receive a second portion of the input RF signal and apply a second gain to the second portion of the input RF signal to generate a second RF signal, wherein the second gain has a second programmable magnitude adjustable by the second magnitude control signal and a second programmable phase adjustable by the second phase control signal, wherein the second magnitude control signal is configured to set the second programmable magnitude according to the IQ modulation vector, and wherein the second phase control signal is configured to set the second programmable phase according to the IQ modulation vector; and
a first 90° hybrid coupler configured to generate an output signal having the IQ modulation vector based on a combination of the first RF signal and the second RF signal.

25. The RF circuit of claim 24, wherein:
the first magnitude control signal is configured to set the first programmable magnitude to either zero or to a first predetermined magnitude according to the IQ modulation vector,
the first phase control signal is configured to set the first programmable phase to either a first phase or to a second phase that is 180° phase shifted relative to the first phase according to the IQ modulation vector,
the second magnitude control signal is configured to set the second programmable magnitude to either zero or to a second predetermined magnitude according to the IQ modulation vector,
the second phase control signal is configured to set the second programmable phase to either the first phase or to the second phase that is 180° phase shifted relative to the first phase according to the IQ modulation vector, and
the first 90° hybrid coupler is configured to steer an output phase of the output signal between 0°, 90°, 180°, and 270° relative phases for offset quadrature phase-shift keying (OQPSK) modulation based on the settings of the first programmable magnitude, the first programmable phase, the second programmable magnitude, and the second programmable phase.

26. The RF circuit of claim 25, further comprising:
a controller configured to adjust the first phase control signal, the second phase control signal, the first magnitude control signal, and the second magnitude control signal in order to steer the output phase of the output signal between 0°, 90°, 180°, and 270° relative phases.

27. The RF circuit of claim 24, wherein the first programmable magnitude and the second programmable magnitude are programmable over a full magnitude range between zero and a maximum predetermined magnitude, and the first programmable phase and the second programmable phase are each programmable to have either a first phase or a second phase that is 180° phase shifted relative to the first phase, such that the IQ modulation vector can be any complex number within a full vector range of IQ modulation vectors.

28. The RF circuit of claim 24, wherein the first 90° hybrid coupler comprises a first output port and a second output port that are used for outputting the output signal, wherein the RF circuit further comprises:
a controller configured to adjust the first programmable magnitude, the first programmable phase, the second programmable magnitude, and the second programmable phase in order to steer the output signal to either the first output port or the second output port.

29. A method of controlling at least one radio frequency (RF) output, the method comprising:
generating, by a first 90° hybrid coupler, a first coupler output signal based on a first RF signal;
generating, by the first 90° hybrid coupler, a second coupler output signal based on the first RF signal, wherein a phase of the second coupler output signal is 90° phase shifted relative to a phase of the first coupler output signal;
applying, by a first power amplifier, a first gain to the first coupler output signal to generate a first amplified signal, wherein the first gain has a first predetermined magnitude and a first programmable phase adjustable by a first phase control signal, wherein the first phase control signal is configured to set the first programmable phase to either a first phase or to a second phase that is 180° phase shifted relative to the first phase;
applying, by a second power amplifier, a second gain to the second coupler output signal to generate a second amplified signal, wherein the second gain has a second predetermined magnitude and a second programmable phase adjustable by a second phase control signal, wherein the second phase control signal is configured to set the second programmable phase to either the first phase or to the second phase that is 180° phase shifted relative to the first phase;
generating and outputting, by a second 90° hybrid coupler, a first output signal from a first output port of the second 90° hybrid coupler based on a combination of the first amplified signal and the second amplified signal when the first programmable phase and the second programmable phase are 180° out-of-phase; and
generating and outputting, by a second 90° hybrid coupler, a second output signal from a second output port of the second 90° hybrid coupler based on a combination of the first amplified signal and the second amplified signal when the first programmable phase and the second programmable phase are in-phase.

30. The method of claim 29, further comprising:
calibrating, by a controller, the first gain, in terms of the first predetermined magnitude and the first programmable phase, and the second gain, in terms of the second predetermined magnitude and the second programmable phase, in order to steer output power between the first output port and the second output port of the second 90° hybrid coupler.

31. The method of claim 29, further comprising:
calibrating, by a controller, the first gain, in terms of the first predetermined magnitude and the first programmable phase, and the second gain, in terms of the second predetermined magnitude and the second programmable phase, in order to steer an output phase of the first output signal between 0°, 90°, 180°, and 270° relative phases.

32. The method of claim 29, further comprising:
applying, by a third power amplifier, a third gain to a first portion of an input RF signal to generate the first RF signal, wherein the third gain has a first programmable magnitude adjustable by a first magnitude control signal and a third programmable phase adjustable by a third phase control signal, wherein the first magnitude control signal is configured to set the first programmable magnitude to either zero or to a third predetermined magnitude, and wherein the third phase control signal is configured to set the third programmable phase to either the first phase or to the second phase that is 180° phase shifted relative to the first phase;
applying, by a fourth power amplifier, a fourth gain to a second portion of the input RF signal to generate a second RF signal, wherein the fourth gain has a second programmable magnitude adjustable by a second magnitude control signal and a fourth programmable phase adjustable by a fourth phase control signal, wherein the second magnitude control signal is configured to set the second programmable magnitude to either zero or to a fourth predetermined magnitude, and wherein the fourth phase control signal is configured to set the fourth programmable phase to either the first phase or to the second phase that is 180° phase shifted relative to the first phase;
generating, by the first 90° hybrid coupler, the first coupler output signal and the second coupler output signal based on the first RF signal or the second RF signal; and
steering, by the second 90° hybrid coupler, an output phase of the first output signal between 0°, 90°, 180°, and 270° relative phases based on the first coupler output signal and the second coupler output signal.

33. The method of claim 32, further comprising:
setting, by a controller, the first phase control signal, the second phase control signal, the third phase control signal, the fourth phase control signal, the first magnitude control signal, and the second magnitude control signal in order to steer an output phase of the first output signal between 0°, 90°, 180°, and 270° relative phases.

* * * * *